(12) United States Patent
Pang et al.

(10) Patent No.: US 12,133,364 B2
(45) Date of Patent: Oct. 29, 2024

(54) PHOTOSENSITIVE ASSEMBLY, CAMERA MODULE AND ELECTRONIC DEVICE

(71) Applicant: GUANGZHOU LUXVISIONS INNOVATION TECHNOLOGY LIMITED, Guangdong (CN)

(72) Inventors: Chao Pang, Guangdong (CN); Lingyun Mi, Guangdong (CN); Bin Qin, Guangdong (CN); Chaoyuan Chan, Guangdong (CN)

(73) Assignee: GUANGZHOU LUXVISIONS INNOVATION TECHNOLOGY LIMITED, Guangdong (CN)

( * ) Notice: Subject to any disclaimer, the term of this patent is extended or adjusted under 35 U.S.C. 154(b) by 170 days.

(21) Appl. No.: 17/954,506

(22) Filed: Sep. 28, 2022

(65) Prior Publication Data

US 2023/0284419 A1    Sep. 7, 2023

(30) Foreign Application Priority Data

Mar. 1, 2022  (CN) .......................... 202220430483.9

(51) Int. Cl.
| | |
|---|---|
| *G06F 1/16* | (2006.01) |
| *H04N 23/55* | (2023.01) |
| *H05K 5/00* | (2006.01) |
| *H05K 7/00* | (2006.01) |
| *H05K 7/20* | (2006.01) |

(52) U.S. Cl.
CPC ......... *H05K 7/20409* (2013.01); *H04N 23/55* (2023.01); *H05K 7/205* (2013.01)

(58) Field of Classification Search
CPC .......... H05K 7/20409; H05K 7/20418; H05K 7/20427; H05K 7/2039; H05K 7/20436; H05K 7/20445; H05K 7/205; H04N 23/55; H04N 23/50
See application file for complete search history.

(56) References Cited

U.S. PATENT DOCUMENTS

| | | | | |
|---|---|---|---|---|
| 10,602,043 | B2* | 3/2020 | Shen | ...................... H04N 23/54 |
| 10,707,249 | B2* | 7/2020 | Shen | ...................... H04N 23/57 |
| 11,163,214 | B2* | 11/2021 | Shen | ...................... G03B 11/00 |
| 2013/0081796 | A1* | 4/2013 | Horiuchi | ............. H01L 21/4882 |
| | | | | 156/247 |

(Continued)

*Primary Examiner* — Anthony M Haughton
(74) *Attorney, Agent, or Firm* — Birch, Stewart, Kolasch & Birch, LLP

(57) ABSTRACT

Provided are a photosensitive assembly, a camera module, and an electronic device. The electronic device includes an electronic device body and a camera module mounted on the electronic device body. The camera module includes a lens and a photosensitive assembly. The photosensitive assembly includes a circuit board, a photosensitive element, a base, and an adhesive. The circuit board is provided with an accommodation cavity that extends through the circuit board. The photosensitive element is accommodated in the accommodation cavity and electrically connected to the circuit board. The base is disposed on the circuit board. The lens is located in the photosensitive path of the photosensitive element. The adhesive includes a first adhesive portion and a second adhesive portion. The first adhesive portion is located in the accommodation cavity. The second adhesive portion is located outside the accommodation cavity.

20 Claims, 5 Drawing Sheets

(56) References Cited

U.S. PATENT DOCUMENTS

| | | | |
|---|---|---|---|
| 2019/0165019 A1* | 5/2019 | Wang | H01L 27/14634 |
| 2020/0304692 A1* | 9/2020 | Li | H04N 23/55 |
| 2021/0021739 A1* | 1/2021 | Chen | H04N 23/54 |
| 2021/0127078 A1* | 4/2021 | Zhao | H02K 41/0356 |
| 2021/0306530 A1* | 9/2021 | Wang | H05K 1/0274 |

* cited by examiner

PHOTOSENSITIVE ASSEMBLY, CAMERA MODULE AND ELECTRONIC DEVICE

CROSS-REFERENCE TO RELATED APPLICATION(S)

This application claims priority to Chinese Patent Application No. 202220430483.9 filed Mar. 1, 2022, the disclosure of which is incorporated herein by reference in its entirety.

TECHNICAL FIELD

The present disclosure relates to the field of camera module technology and, in particular, to a photosensitive assembly, a camera module, and an electronic device.

BACKGROUND

As an important imaging tool, a camera module is widely used in electrical equipment such as unmanned aerial vehicles, robots, and intelligent electric appliances. Assembly of a photosensitive assembly in a traditional camera module usually requires a bearing plate disposed under a circuit board. To secure the photosensitive assembly to the circuit board, glue is applied on the bearing plate. In this manner, the height of the camera module is increased, and thus the applicable range of the camera module is reduced.

SUMMARY

The present disclosure is to provide a photosensitive assembly, a camera module, and an electronic device, which can not only ensure the product quality, but also reduce the setting range, debugging time and cost during the testing process of the electronic device.

A photosensitive assembly includes a circuit board provided with an accommodation cavity that extends through the circuit board; a photosensitive element accommodated in the accommodation cavity and electrically connected to the circuit board; a base disposed on the circuit board; and an adhesive including a first adhesive portion and a second adhesive portion. The first adhesive portion and the second adhesive portion are connected to each other. The first adhesive portion is located in the accommodation cavity. The first adhesive portion is connected to the photosensitive element and the circuit board. The second adhesive portion is located outside the accommodation cavity. The second adhesive portion is disposed on the surface of the circuit board facing the base. The base is connected to or not connected to the second adhesive portion.

In an embodiment, a heat sink is disposed on the surface of the photosensitive element facing away from the base. The heat sink is located outside the accommodation cavity.

In an embodiment, part of the first adhesive portion is sandwiched between the inner peripheral surface of the base and the outer peripheral surface of the photosensitive element, and another part of the first adhesive portion extends to the edge of the top surface of the photosensitive element.

In an embodiment, the photosensitive assembly also includes a filter and an optical window formed on the base. The optical window corresponds to the photosensitive region of the photosensitive element. The filter is accommodated in the optical window.

In an embodiment, the optical window is a stepped hole extending through the base. The stepped hole includes a large-diameter hole and a small-diameter hole. One end of the large-diameter hole communicates with the surface of the base facing the photosensitive element. Another end of the large-diameter hole communicates with one end of the small-diameter hole. Another end of the small-diameter hole communicates with the surface of the base facing away from the photosensitive element. The filter is accommodated in the small-diameter hole. The second adhesive portion is bonded to the filter.

In an embodiment, the optical window is a stepped hole extending through the base. The stepped hole includes a large-diameter hole and a small-diameter hole. One end of the large-diameter hole communicates with the surface of the base facing the photosensitive element. Another end of the large-diameter hole communicates with one end of the small-diameter hole. Another end of the small-diameter hole communicates with the surface of the base facing away from the photosensitive element. A stop block is disposed on the hole wall of the small-diameter hole. The filter is disposed on the stop block.

In an embodiment, a camera module is also provided. The camera module includes a lens and the preceding photosensitive assembly. The lens is located in the photosensitive path of the photosensitive element.

In an embodiment, the camera module also includes a lens carrier. The lens carrier is disposed on the base. The lens is mounted on the lens carrier.

In an embodiment, the camera module also includes a motor brake electrically connected to the circuit board. The motor brake is disposed on the base. The lens is mounted on the motor brake.

In an embodiment, an electronic device is also provided. The electronic device includes an electronic device body and the preceding camera module. The camera module is mounted on the electronic device body.

DETAILED DESCRIPTION

Figure 1:
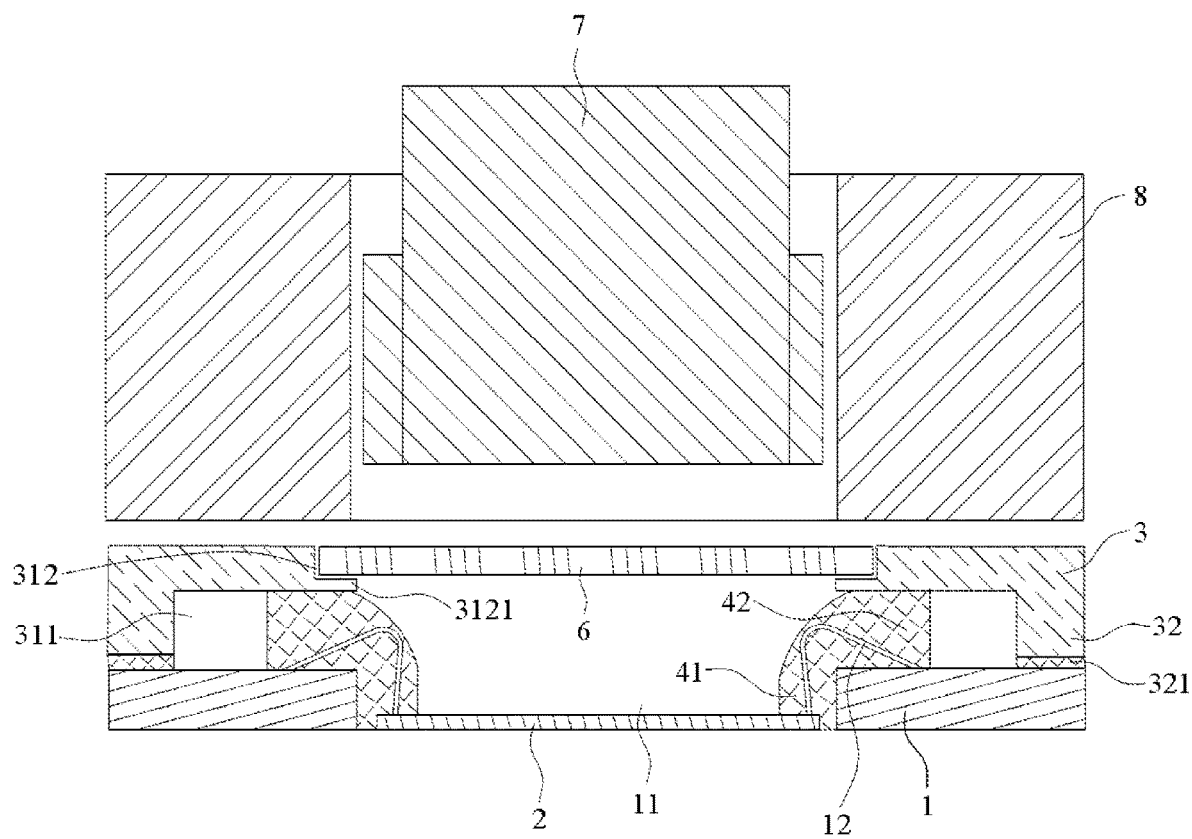
FIG. 1 is section view one of a camera module according to embodiment one of the present disclosure.

Embodiments of the present disclosure are described in detail below. Examples of the embodiments are illustrated in the drawings, where the same or similar reference numerals indicate the same or similar elements or components or indicate elements or components having the same or similar functions. The embodiments described below with reference to the drawings are exemplary, intended to explain the present disclosure, and not to be construed as limiting the present disclosure.

In the description of embodiments of the present utility mode, unless otherwise expressly specified and limited, the term "connected to each other", "connected" or "fixed" is to be construed in a broad sense, for example, as fixedly connected, detachably connected, mechanically connected or electrically connected, directly connected to each other or indirectly connected to each other via an intermediary, or internally connected or interactional between two components. For those of ordinary skill in the art, meanings of the preceding terms in the present disclosure may be understood depending on the situation.

In the description of the present disclosure, unless otherwise expressly specified and limited, when a first feature is described as "on" or "below" a second feature, the first feature and the second feature may be in direct contact or may be in contact via another feature between the two features instead of being in direct contact. Moreover, when the first feature is described as "on", "above", or "over" the second feature, the first feature is right on, above, or over the second feature, or the first feature is obliquely on, above, or over the second feature, or the first feature is simply at a higher level than the second feature. When the first feature is described as "under", "below", or "underneath" the second feature, the first feature is right under, below, or underneath the second feature, or the first feature is obliquely under, below, or underneath the second feature, or the first feature is simply at a lower level than the second feature.

Solutions of the present disclosure are described below through embodiments in conjunction with the drawings.

Embodiment One

Figure 2:
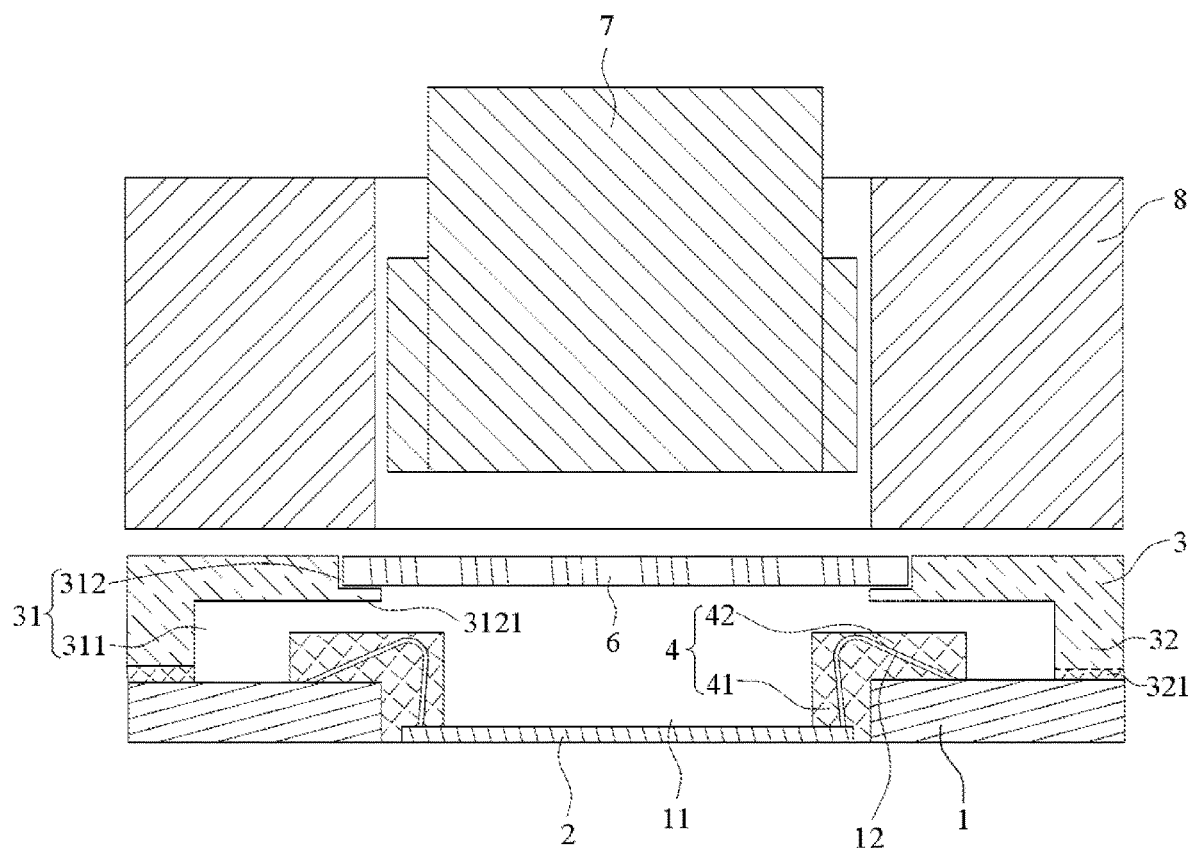
FIG. 2 is section view two of a camera module according to embodiment one of the present disclosure.

As shown in FIGS. 1 and 2, this embodiment of the present disclosure provides an electronic device. The electronic device includes an electronic device body and a camera module. The camera module is mounted on the electronic device body. The camera module in this embodiment includes a lens 7 and a photosensitive assembly. The photosensitive assembly includes a circuit board 1, a base 3, and an adhesive 4. The circuit board 1 is provided with an accommodation cavity 11 that extends through the circuit board 1. The photosensitive element 2 is electrically connected to and accommodated in the accommodation cavity 11. The base 3 is disposed on the upper surface of the circuit board 1. The adhesive 4 includes a first adhesive portion 41 and a second adhesive portion 42. The first adhesive portion 41 and the second adhesive portion 42 are connected to each other. The first adhesive portion 41 is located in the accommodation cavity 11. The first adhesive portion 41 is connected to the photosensitive element 2 and the circuit board 1. The second adhesive portion 42 is located outside the accommodation cavity 11. The second adhesive portion 42 is disposed on the surface of the circuit board 1 facing the base 3. Referring to FIG. 1, the base 3 is connected to the second adhesive portion 42. In other embodiments, referring to FIG. 2, the base 3 may not be connected to the second adhesive portion 42. The lens 7 of the camera module is located in the photosensitive path of the photosensitive element 2 so that light reflected by an object can pass through the lens 7. Then the photons collide with the photosensitive region of the photosensitive element 2 and generate an electrical signal corresponding to an image. The electrical signal is converted into a digital signal by the circuit board 1. The digital signal is stored by the circuit board 1.

With regard to the photosensitive assembly according to this embodiment, the first adhesive portion 41 located in the accommodation cavity 11 bonds the photosensitive element 2 to the circuit board 1. In this manner, a bearing plate can be omitted under the photosensitive element 2 and the circuit board 1, the height of the photosensitive assembly can be reduced, and thereby the photosensitive assembly can be applied to a smaller camera module and a smaller electric device. In addition, when the second adhesive portion 42 and the base 3 are bonded to each other, the structural strength of the photosensitive assembly can be enhanced.

With regard to the camera module and the electronic device according to this embodiment, the structural arrangement of the photosensitive assembly makes the overall height of the camera module and the camera module smaller and makes the volume of the electronic device smaller.

In an embodiment, referring to FIGS. 1 and 2, part of the first adhesive portion 41 is sandwiched between the inner peripheral surface of the base 3 and the outer peripheral surface of the photosensitive element 2. Another part of the first adhesive portion 41 extends to the edge of the top surface of the photosensitive element 2. This arrangement of the first adhesive portion 41 ensures that the photosensitive element 2 is securely connected to the circuit board 1. Moreover, the first adhesive portion 41 is bonded to the outer edge of the photosensitive element 2 and is not bonded to the photosensitive region of the photosensitive element 2, thereby not affecting the operation of the photosensitive element 2.

In an embodiment, the first adhesive portion 41 and the second adhesive portion 42 included in the adhesive 4 in this embodiment extend along the periphery of the photosensitive element 2 to form an annular structure. Between the outer periphery of the photosensitive element 2 and the inner periphery of the circuit board 1, an annular gap is formed. Part of the first adhesive portion 41 sandwiched between the circuit board 1 and the photosensitive element 2 can be located in the annular gap so that the adhesive 4 can stably secure the photosensitive element 2 and the circuit board 1 along the periphery of the photosensitive element 2.

In an embodiment, the adhesive 4 according to this embodiment may be a thermosetting adhesive. The thermosetting adhesive solidifies when backed for more than half an hour at a temperature of more than 60 degrees.

In an embodiment, referring to FIGS. 1 and 2, the photosensitive assembly also includes a filter 6 and an optical window 31 disposed on the base 3. The optical window 31 corresponds to the photosensitive region of the photosensitive element 2. The filter 6 can filter out unnecessary light so that the imaging of the camera module is clearer.

In an embodiment, referring to FIGS. 1 and 2, the optical window 31 is a stepped hole extending through the base 3. The stepped hole includes a large-diameter hole 311 and a small-diameter hole 312. One end of the large-diameter hole 311 communicates with the surface of the base 3 facing the photosensitive element 2. Another end of the large-diameter hole 311 communicates with one end of the small-diameter hole 312. Another end of the small-diameter hole 312 communicates with the surface of the base 3 facing away from the photosensitive element 2. In an embodiment, a stop block 3121 is disposed on the hole wall of the small-diameter hole 312. The filter 6 is disposed on the stop block 3121. The stop block 3121 serves to secure the filter 6. The second adhesive portion 42 is accommodated in the large-diameter hole 311. Referring to FIG. 1, the stop block 3121 is connected to the second adhesive portion 42, thereby enhancing the overall structure strength of the photosensitive assembly. In other embodiments, referring to FIG. 2, the stop block 3121 may not be connected to the second adhesive portion 42, thereby saving the use amount of the adhesive 4.

In an embodiment, referring to FIGS. 1 and 2, with the arrangement of the large-diameter hole 311, a protrusion 32 is formed at the outer edge of the base 3. An adhesive layer 321 is sandwiched between the protrusion 32 and the circuit board 1. The adhesive layer 321 can secure the base 3 to the circuit board 1. In an embodiment, the adhesive layer 321 extends along the periphery of the base 3 to seal the gap between the base 3 and the circuit board 1.

In an embodiment, referring to FIGS. 1 and 2, the circuit board 1 and the photosensitive element 2 are electrically connected by a wire 12. The wire 12 is bonded in the adhesive 4.

In an embodiment, referring to FIGS. 1 and 2, the camera module also includes a lens carrier 8. The lens carrier 8 is disposed on the base 3. The lens 7 is mounted on the lens carrier 8. The lens 7 faces the small-diameter hole 312 of the optical window 31. After light reflected by an object passes through the lens 7 and passes through the filter 6, the photons collide with the photosensitive element 2 and generate an electrical signal corresponding to an image. The electrical signal is converted into a digital signal by the circuit board 1. The digital signal is stored by the circuit board 1.

Embodiment Two

Figure 3:
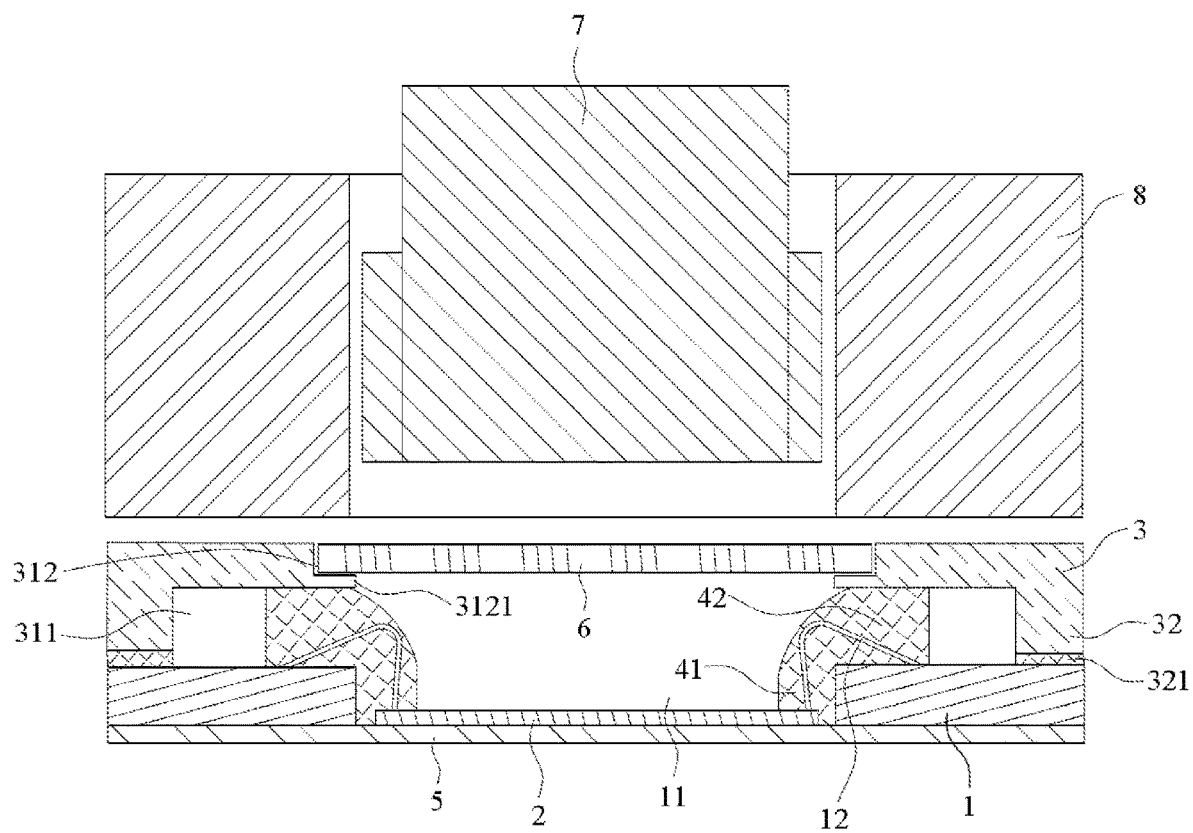
FIG. 3 is a section view of a camera module according to embodiment two of the present disclosure.

The present disclosure provides a photosensitive assembly. The photosensitive assembly of the present disclosure includes a circuit board 1, a photosensitive element 2, a base 3, and an adhesive 4. Referring to FIG. 3, this embodiment differs from embodiment one in that a heat sink 5 is disposed on the surface of the photosensitive element 2 facing away from the base 3. The heat sink 5 is located outside the accommodation cavity 11 to reduce the heat of the photosensitive element 2. The thickness of the heat sink 5 in this embodiment is 0.01-0.05 millimeters so that the overall thickness of the photosensitive assembly does not increase unduly.

In an embodiment, the heat sink 5 can extend to the lower surface of the circuit board 1 to reduce the heat of the circuit board 1. The area of the heat sink 5 in this embodiment may be set according to the product design requirements.

Embodiment Three

Figure 4:
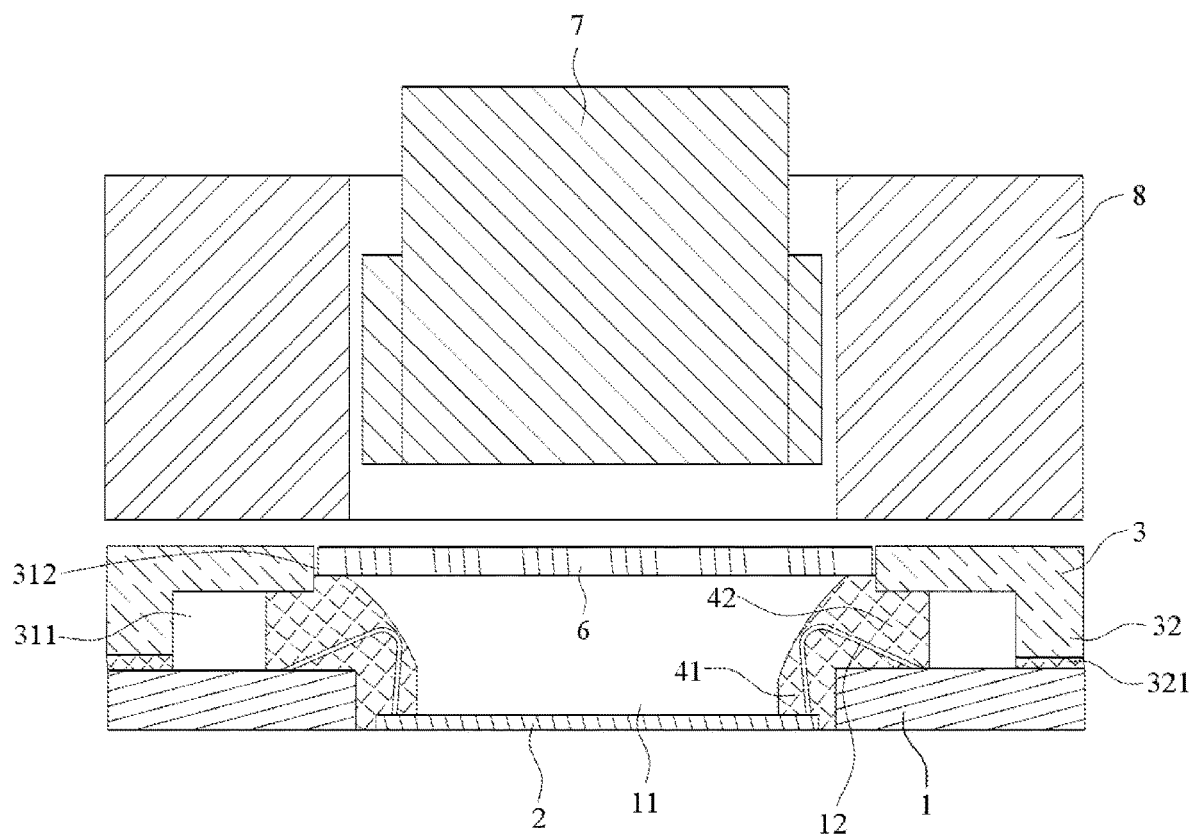
FIG. 4 is a section view of a camera module according to embodiment three of the present disclosure.

This embodiment provides a photosensitive assembly. The photosensitive assembly includes a circuit board 1, a photosensitive element 2, a base 3, and an adhesive 4. Referring to FIG. 4, this embodiment differs from embodiment one in that the optical window 31 is a stepped hole extending through the base 3. The stepped hole includes a large-diameter hole 311 and a small-diameter hole 312. One end of the large-diameter hole 311 communicates with the surface of the base 3 facing the photosensitive element 2. Another end of the large-diameter hole 311 communicates with one end of the small-diameter hole 312. Another end of the small-diameter hole 312 communicates with the surface of the base 3 facing away from the photosensitive element 2. The filter 6 is accommodated in the small-diameter hole 312. The second adhesive portion 42 is bonded to the filter 6. The second adhesive portion 42 is bonded to the circuit board 1, the base 3, and the filter 6 to secure the filter 6. The optical window 31 and the large-diameter hole 311 and the small-diameter hole 312 of the optical window 31 in this embodiment are the same as those in embodiment one. Therefore, the reference numerals in this embodiment are the same as those in embodiment one.

Embodiment Four

Figure 5:
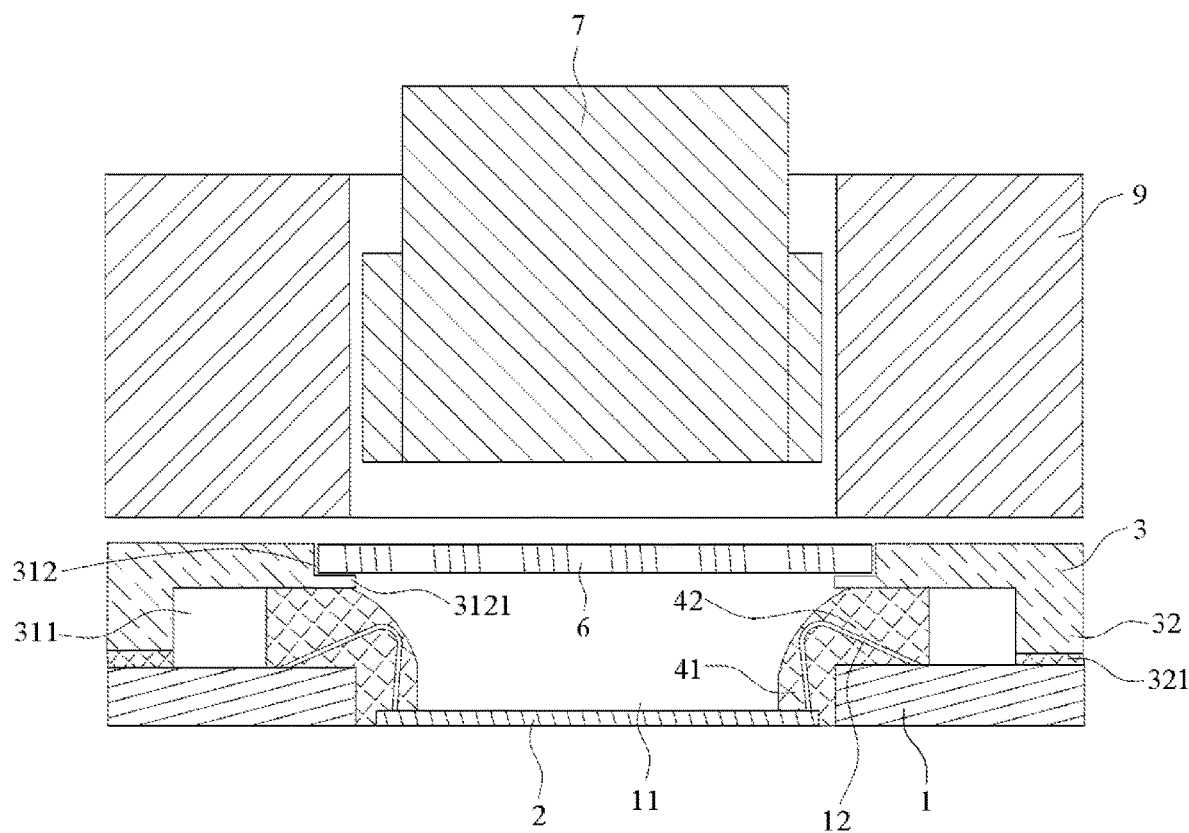
FIG. 5 is a section view of a camera module according to embodiment four of the present disclosure.

This embodiment provides a camera module. The camera module includes a lens 7 and a photosensitive assembly. The lens 7 is located in the photosensitive path of the photosensitive element 2. Referring to FIG. 5, this embodiment differs from embodiment one in that no lens carrier 8 is disposed in the camera module, but a motor brake 9 is disposed on the base 3. The motor brake 9 is electrically connected to the circuit board 1. The lens 7 is mounted on the motor brake 9. The lens 7 can autofocus quickly and accurately with the coordination between the lens 7 and the motor brake 9.

Apparently, the preceding embodiments of the present disclosure are example embodiments for clearly illustrating the present disclosure and are not intended to limit the implementations of the present disclosure. For those of ordinary skill in the art, modifications or changes in different forms may also be made based on the preceding description. Implementations cannot be all and do not need to be all exhausted herein. Any modifications, equivalent substitutions, and improvements made within the spirit and principle of the present disclosure fall within the scope of the claims of the present disclosure.

What is claimed is:

1. A photosensitive assembly, comprising:
   a circuit board provided with an accommodation cavity that extends through the circuit board;
   a photosensitive element accommodated in the accommodation cavity and electrically connected to the circuit board;
   a base disposed on the circuit board; and
   an adhesive comprising a first adhesive portion and a second adhesive portion, wherein the first adhesive portion (41) and the second adhesive portion (42) are connected to each other, the first adhesive portion is located in the accommodation cavity, the first adhesive portion (41) is connected to the photosensitive element and the circuit board, the second adhesive portion is located outside the accommodation cavity, the second adhesive portion is disposed on a surface of the circuit board facing the base, and the base is connected to or not connected to the second adhesive portion.

2. The photosensitive assembly according to claim 1, wherein a heat sink is disposed on a surface of the photosensitive element facing away from the base, and the heat sink is located outside the accommodation cavity.

3. The photosensitive assembly according to claim 1, wherein part of the first adhesive portion is sandwiched between an inner peripheral surface of the base and an outer peripheral surface of the photosensitive element, and another part of the first adhesive portion extends to an edge of a top surface of the photosensitive element facing the base.

4. The photosensitive assembly according to claim 1, further comprising
   an optical window formed on the base, wherein a position of the optical window corresponds to a photosensitive region of the photosensitive element; and
   a filter accommodated in the optical window.

5. The photosensitive assembly according to claim 4, wherein the optical window is a stepped hole extending through the base, and the stepped hole comprises a large-diameter hole and a small-diameter hole, wherein one end of the large-diameter hole communicates with a surface of the base facing the photosensitive element, another end of the large-diameter hole communicates with one end of the small-diameter hole, and another end of the small-diameter hole communicates with a surface of the base facing away from the photosensitive element, and wherein the filter is accommodated in the small-diameter hole, and the second adhesive portion is bonded to the filter.

6. The photosensitive assembly according to claim 4, wherein the optical window is a stepped hole extending through the base, and the stepped hole comprises a large-diameter hole and a small-diameter hole, wherein one end of the large-diameter hole communicates with a surface of the base facing the photosensitive element, another end of the large-diameter hole communicates with one end of the small-diameter hole, another end of the small-diameter hole communicates with a surface of the base facing away from the photosensitive element, and wherein a stop block is disposed on a hole wall of the small-diameter hole, and the filter is disposed on the stop block.

7. A camera module, comprising a lens and a photosensitive assembly, wherein
the photosensitive assembly comprises:
a circuit board provided with an accommodation cavity that extends through the circuit board;
a photosensitive element accommodated in the accommodation cavity and electrically connected to the circuit board;
a base disposed on the circuit board; and
an adhesive comprising a first adhesive portion and a second adhesive portion, wherein the first adhesive portion and the second adhesive portion are connected to each other, the first adhesive portion is located in the accommodation cavity, the first adhesive portion is connected to the photosensitive element and the circuit board, the second adhesive portion is located outside the accommodation cavity, the second adhesive portion is disposed on a surface of the circuit board facing the base, and the base is connected to or not connected to the second adhesive portion; and
the lens is located in a photosensitive path of the photosensitive element.

8. The camera module according to claim 7, further comprising a lens carrier, wherein the lens carrier is disposed on the base, and the lens is mounted on the lens carrier.

9. The camera module according to claim 7, further comprising a motor brake electrically connected to the circuit board, wherein the motor brake is disposed on the base, and the lens is mounted on the motor brake.

10. The camera module according to claim 7, wherein a heat sink is disposed on a surface of the photosensitive element facing away from the base, and the heat sink is located outside the accommodation cavity.

11. The camera module according to claim 7, wherein part of the first adhesive portion is sandwiched between an inner peripheral surface of the base and an outer peripheral surface of the photosensitive element, and another part of the first adhesive portion extends to an edge of a top surface of the photosensitive element.

12. The camera module according to claim 7, wherein the photosensitive assembly further comprises a filter and an optical window formed on the base, wherein the optical window corresponds to a photosensitive region of the photosensitive element, and the filter is accommodated in the optical window.

13. The camera module according to claim 12, wherein the optical window is a stepped hole extending through the base, and the stepped hole comprises a large-diameter hole and a small-diameter hole, wherein one end of the large-diameter hole communicates with a surface of the base facing the photosensitive element, another end of the large-diameter hole communicates with one end of the small-diameter hole, another end of the small-diameter hole communicates with a surface of the base facing away from the photosensitive element, the filter is accommodated in the small-diameter hole, and the second adhesive portion is bonded to the filter.

14. The camera module according to claim 12, wherein the optical window is a stepped hole extending through the base, and the stepped hole comprises a large-diameter hole and a small-diameter hole, wherein one end of the large-diameter hole communicates with a surface of the base facing the photosensitive element, another end of the large-diameter hole communicates with one end of the small-diameter hole, another end of the small-diameter hole communicates with a surface of the base facing away from the photosensitive element, a stop block is disposed on a hole wall of the small-diameter hole, and the filter is disposed on the stop block.

15. An electronic device, comprising an electronic device body and a camera module, wherein
the photosensitive assembly comprises:
a circuit board provided with an accommodation cavity that extends through the circuit board;
a photosensitive element accommodated in the accommodation cavity and electrically connected to the circuit board;
a base disposed on the circuit board; and
an adhesive comprising a first adhesive portion and a second adhesive portion, wherein the first adhesive portion and the second adhesive portion are connected to each other, the first adhesive portion is located in the accommodation cavity, the first adhesive portion is connected to the photosensitive element and the circuit board, the second adhesive portion is located outside the accommodation cavity, the second adhesive portion is disposed on a surface of the circuit board facing the base, and the base is connected to or not connected to the second adhesive portion; and
the camera module is mounted on the electronic device body.

16. The electronic device according to claim 15, wherein a heat sink is disposed on a surface of the photosensitive element facing away from the base, and the heat sink is located outside the accommodation cavity.

17. The electronic device according to claim 15, wherein part of the first adhesive portion is sandwiched between an inner peripheral surface of the circuit board and an outer peripheral surface of the photosensitive element, and another part of the first adhesive portion extends to an edge of a top surface of the photosensitive element.

18. The electronic device according to claim 15, wherein the photosensitive assembly further comprises a filter and an optical window formed on the base, wherein the optical window corresponds to a photosensitive region of the photosensitive element, and the filter is accommodated in the optical window.

19. The electronic device according to claim 15, wherein the camera module further comprises a lens carrier, wherein the lens carrier is disposed on the base, and the lens is mounted on the lens carrier.

20. The electronic device according to claim 15, wherein the camera module further comprises a motor brake electrically connected to the circuit board, wherein the motor brake is disposed on the base, and the lens is mounted on the motor brake.

* * * * *